United States Patent
Bishop

(10) Patent No.: US 8,942,938 B2
(45) Date of Patent: Jan. 27, 2015

(54) ELECTROMAGNETIC SPECTRUM AERIAL SURVEYING

(75) Inventor: Donald M. Bishop, Ashburn, VA (US)

(73) Assignee: ICF International, Inc., Fairfax, VA (US)

( * ) Notice: Subject to any disclaimer, the term of this patent is extended or adjusted under 35 U.S.C. 154(b) by 434 days.

(21) Appl. No.: 13/267,564

(22) Filed: Oct. 6, 2011

(65) Prior Publication Data

US 2013/0090874 A1   Apr. 11, 2013

(51) Int. Cl.
G01R 23/16 (2006.01)
G01R 13/02 (2006.01)
G06F 19/00 (2011.01)
G01S 3/00 (2006.01)

(52) U.S. Cl.
CPC ............... *G01R 13/02* (2013.01); *G06F 19/00* (2013.01); *G01S 3/00* (2013.01); *G01R 23/16* (2013.01)
USPC .............................................. 702/76; 702/67

(58) Field of Classification Search
USPC ................. 702/67, 76; 324/323–377
See application file for complete search history.

(56) References Cited

U.S. PATENT DOCUMENTS

| | | | | |
|---|---|---|---|---|
| 4,611,164 A * | 9/1986 | Mitsuyoshi et al. | ....... | 324/76.19 |
| 5,493,339 A * | 2/1996 | Birch et al. | ................... | 348/461 |
| 5,862,260 A * | 1/1999 | Rhoads | ........................ | 382/232 |
| 6,526,284 B1 * | 2/2003 | Sharp et al. | ............... | 455/456.6 |
| 6,606,055 B2 * | 8/2003 | Halsema et al. | .............. | 342/368 |
| 6,829,471 B2 * | 12/2004 | White et al. | ............... | 455/194.2 |
| 6,844,855 B2 * | 1/2005 | Carson | ........................ | 343/705 |
| 7,974,654 B2 * | 7/2011 | Tomioka et al. | ........... | 455/550.1 |
| 2003/0014185 A1 * | 1/2003 | Kim | ............................... | 701/202 |
| 2003/0069693 A1 * | 4/2003 | Snapp et al. | ................... | 701/213 |
| 2008/0186235 A1 * | 8/2008 | Struckman et al. | .......... | 342/465 |
| 2008/0204310 A1 * | 8/2008 | Blessing et al. | .............. | 342/195 |
| 2009/0306920 A1 * | 12/2009 | Zwinger et al. | ................. | 702/77 |
| 2010/0093270 A1 * | 4/2010 | Bass | ............................... | 455/1 |
| 2012/0009942 A1 * | 1/2012 | Zoubir | ....................... | 455/456.1 |

* cited by examiner

*Primary Examiner* — Sujoy Kundu
*Assistant Examiner* — Lisa Peters
(74) *Attorney, Agent, or Firm* — William W. Cochran; Cochran Freund & Young LLC

(57) ABSTRACT

Disclosed is an aerial surveying system for collecting electromagnetic spectrum data. Spectrally tuned antennas are used on an airplane to prefilter the data in accordance with spectral frequency bands. The data is sequentially sampled using an antenna switching device, band pass filtered and downconverted to an intermediate frequency. High speed vector signal analyzers and digitizers create frequency spectral data and I and Q temporal data. The collected data is recorded and compressed using any desirable compression technique, including video compression. Data analyzers analyze the data and display the data on a GIS map.

23 Claims, 5 Drawing Sheets

ELECTROMAGNETIC SPECTRUM AERIAL SURVEYING

BACKGROUND OF THE INVENTION

The Federal Communications Commission (FCC) and the National Telecommunications and Information Administration (NTIA) manage and control the use of the electromagnetic spectrum within the United States. These agencies are responsible for assigning frequency spectrum to various industries, and have controlled usage of the electromagnetic spectrum for TV broadcasters, radio operators, the cell phone industry, satellite communication industry, private citizens and various other users of the electromagnetic spectrum for many years. Although the FCC and the NTIA have the responsibility for licensing and managing the electromagnetic spectrum, very little empirical data exists that shows how the spectrum is actually being used.

SUMMARY OF THE INVENTION

An embodiment of the present invention may therefore comprise a method of collecting electromagnetic signals having a broad frequency spectrum over a large geographical area comprising: detecting the electromagnetic signals from an aircraft using a plurality of antennas that are tuned to a plurality of frequency bands to produce a plurality of frequency band antenna signals from the plurality of antennas; band pass filtering the frequency band antenna signals to produce a plurality of filtered frequency band signals; digitizing the plurality of filtered frequency band signals to produce digitized frequency band signals; analyzing the digitized frequency band signals to provide analyzed frequency band data regarding the electromagnetic signals.

An embodiment of the present invention may further comprise a system for collecting data relating to a broad frequency spectrum of electromagnetic signals over a large geographical area comprising: a plurality of antennas that are mounted on an aircraft that flies patterns over the large geographical area at altitudes that are sufficiently low to detect the electromagnetic signals, the antennas tuned to a plurality of frequency bands to produce a plurality of frequency band antenna signals from the plurality of antennas; band pass filters that filter the frequency band antenna signals to produce a plurality of filtered frequency band signals; analog to digital converters that digitize the filtered frequency band signals to produce digitized frequency band signals; analyzers that analyze the digitized frequency band signals to provide analyzed frequency band data regarding the electromagnetic signals.

DETAILED DESCRIPTION OF THE EMBODIMENTS

Figure 1A:
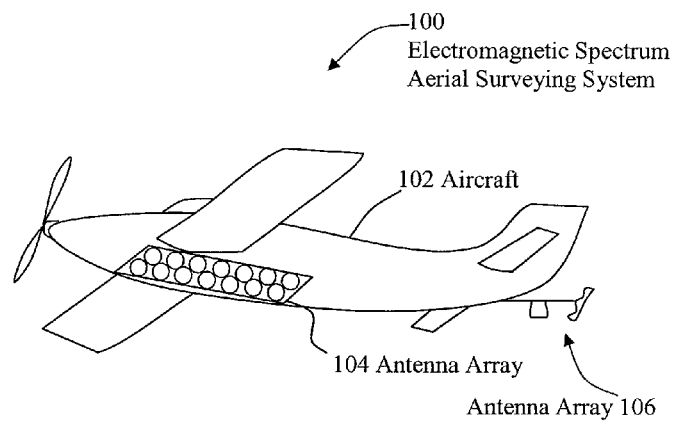
FIG. 1A is a schematic illustration of an embodiment of an electromagnetic spectrum aerial surveying system.
Figure 1A:
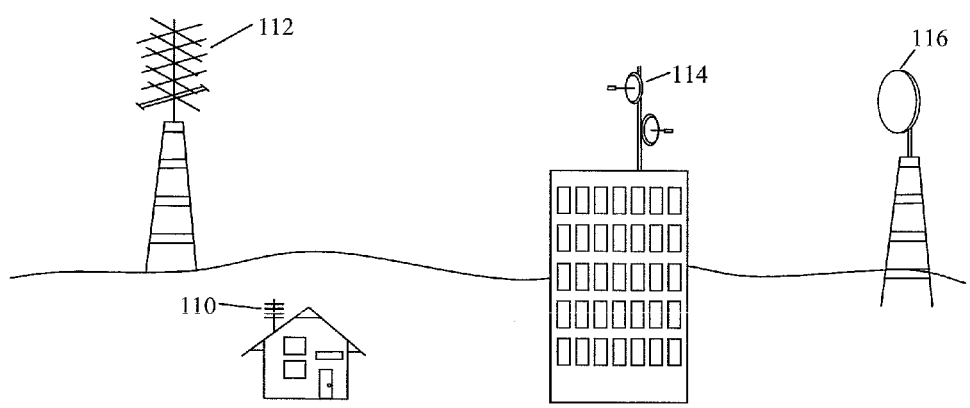

FIG. 1A is a schematic representation of an electromagnetic spectrum aerial surveying system. As shown in FIG. 1A, an aircraft, such as airplane 102, has an antenna array 104 that is attached to a lower portion of airplane 102 and an antenna array 106 attached to the tail of airplane 102 to scan electromagnetic radiation generated from electromagnetic sources, such as antennas 110, 112, 114, 116. Ground-based antennas 110, 112, 114, 116 may comprise numerous different types of antennas for transmitting signals at various frequencies and various modulation protocols. For example, antenna 112 may be mounted on top of a tower that broadcasts TV signals over the air. Antenna 114 may be a set of antennas that transmit and receive personal communication service (PCS) wireless communications. Antenna 116 may be a microwave repeater mounted on a tower for transmitting broad spectrum microwave signals over substantial distances using high power microwave signals. Antenna 110 may be a ham radio antenna utilized by a ham radio operator that transmits and receives wireless communications over the ham radio designated spectra.

Each of the antennas 110-116 may be specifically constructed to transmit and receive various bands of the electromagnetic spectrum that are modulated using various techniques. The antenna arrays 104, 106, illustrated in FIG. 1A, may comprise antennas that are specifically designed and tuned to receive various bands of electromagnetic transmissions. For example, antennas 104, 106 can be designed to have a high gain for specific frequency bands and high out-of-band rejection for frequencies outside of the frequencies for which the antenna is designed for high gain. In addition, antenna arrays 104, 106 can be designed for gain directivity. For example, horn antennas can be used that have a high degree of gain directivity. Microwave horns consist of a flared metal waveguide that is shaped like a horn. Parabolic curves assist in matching the wave guide of the horn to match the impedance of free space at 377 ohms. Patch antennas, which are also known as rectangular microstrip antennas, have a low profile and are easily mounted on a flat surface. Patch antennas typically comprise a flat rectangular sheet, or patch of metal, that is mounted over a larger ground plane sheet. Patch antennas are usually constructed to be one-half wavelength long. Patch antennas have good directivity in a direction that is perpendicular to the patch and ground plane. Log periodic antennas can also be used. Log periodic arrays, or log periodic beam antennas, are unidirectional, narrow beam antennas that have impedance and radiation characteristics that are repetitive as a logarithmic function of the excitation frequency. Fractal antennas use a self-similar design to maximize length or increase perimeter size for a given area or volume of an antenna. Fractal antennas are used for wideband and multiband applications. Collinear antenna arrays are an array of dipole antennas mounted in a manner that each antenna is parallel and located along a common axis. Overall gain and directivity can be achieved by mounting the collinear array along a single axis.

The antenna arrays 104, 106 that are mounted on the airplane 102, are preferentially directional antennas, such as horn antennas, fractal antennas, collinear antennas, log periodic antennas, patch antennas, etc., as described above. In addition, other types of directional antennas can be used, such as AWX antennas, beverage antennas, cantenna, ground dipole antennas, helical antennas, horizontal curtain antennas, inverted vee antennas, log-periodic antennas, loop antennas, microstrip antennas, phased array antennas, parabolic antennas, plasma antennas, quad antennas, reflective array antennas, regenerative loop antennas, rhombic antennas, sector antennas, short backfire antennas, slot antennas, turnstile antennas, Vivaldi antennas, and Yagi-Uda antennas.

Aircraft 102, illustrated in FIG. 1A, may constitute any desired type of aircraft, including airplanes, helicopters, blimps, ultralights, and the like. Aircraft 102 flies a pattern over a geographical area to detect the broadband electromagnetic spectrum. The aircraft 102 may fly at an altitude of 500 to 1,500 feet, which allows line of sight detection of ground-based electromagnetic transmissions. Antenna arrays 104, 106 are directed downwardly to detect emissions that originate from under the aircraft 102 and nearby areas. Although the antenna arrays 104, 106 are directed downwardly, antenna arrays 104, 106 can receive signals from an angle, based on the reception cone of the antenna arrays 104, 106. As such, signals that are transmitted from a directional antenna at ground level, such as a collinear antenna array, can be detected at a certain range. For example, if a collinear antenna array mounted on a tower has a transmission cone with a 10° up angle, transmissions from the collinear antenna array will be received at a certain distance by the antenna array 104. In other words, the most powerful signal transmitted from a ground-based collinear antenna array, or other directional antenna, may not be detected directly over the antenna, but at some distance from the antenna. In this case, by looking at the signal strengths of the transmission pattern of a ground-based antenna, the location of the transmission tower can be determined. In addition, aerial surveying of the electromagnetic spectrum allows line of sight collection of electromagnetic emissions and, in general, is not burdened with ground scatter interference, gaps in coverage, signal reflections, and other problems that are common in signals collected from ground-based scanners.

In that regard, although the FCC and the NTIA license and manage the electromagnetic spectrum in the U.S., these agencies do not license or manage the installation of transmission towers. In addition, these agencies do not control or license the types of transmissions that are allowed within the frequency spectrum band that is licensed to the users. For example, cell phone companies may be using antiquated equipment for cell phone transmissions that does not utilize modulation techniques that create high density data transmissions. Similarly, TV broadcasters may be underutilizing a spectrum that was licensed to the TV broadcasters decades ago. For example, the licensed TV spectrum may be used to transmit NTSC compliant amplitude modulated signals. As such, the FCC and the NTIA generally do not have information relating to the manner in which the spectrum is being used by the licensed users. Hence, the manner in which the licensed spectrum is being used in any particular geographical area in the United States is not well known. Actual empirical data that provides information as to the manner in which the spectrum is being used is valuable in assisting the FCC and the NTIA in determining proper allocation of the electromagnetic spectrum.

Further, empirical data can also reveal unlicensed use of spectrum, to pinpoint sources of unlicensed use, which will allow the FCC and the NTIA to police the electromagnetic spectrum and assess fines for unlicensed usage.

Additionally, in the process of planning radio transmissions and radio reception, the current method used employs normal physics models using ray trace and other techniques to forecast coverage and to plot graphical propagation predictions. However, these physics models are based heavily on many presumptions regarding radio transmitter performance, signal format resilience, scatter compensation, coding gain, and antenna performance. For example, in determining the location of cell phone towers, it is important to ensure that the towers are located so that full coverage is provided in the geographical area of interest. Although the spacing and location of the cell towers can be modeled using physics models based upon software that performs ray trace and plot predictions, the accuracy of these predictions is low. Accordingly, systems are typically modeled, built and then tested to determine coverage areas. Inefficiencies in transmitters, antennas, proper aiming of the antennas, and other factors, may greatly modify the modeled transmission coverage.

For these reasons, taking real measurements and recording real empirical data is the best way to determine signal transmission characteristics. Presently, little or no empirical data exists that provides this valuable information. Using the electromagnetic spectrum aerial surveying system 100, this empirical data can be collected over huge geographical areas and can provide not only the information relating to frequency usage and signal magnitude, but also signal quality using post-processing techniques. For example, using the techniques of the various embodiments disclosed herein, each licensed frequency band can be analyzed to determine the carriers that exist in each band in a given geographic region, the channel spacing that is being used, and the modulation format that is being used. If old and inefficient protocols are being used, the spectrum has low information density (data density). If modern, high efficiency protocols are being used, high information density (data density) results. Further, the electromagnetic spectrum aerial surveying system 100 can determine if sections of the spectrum are fallow in any given geographical area.

Figure 1B:
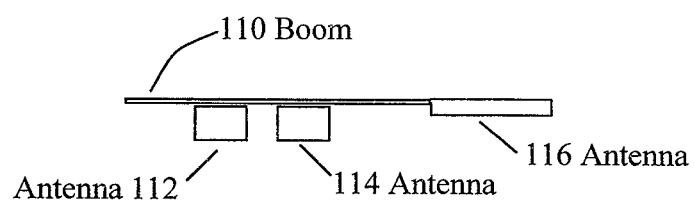
FIGS. 1B and 1C illustrate a boom that is connected to a tail of an aircraft having antennas.
Figure 1C:
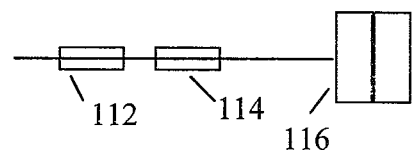

FIGS. 1B and 1C are illustrations of the manner in which airplane 102 can collect data using a boom 110 attached to the tail of the airplane 102. Boom 110 can be securely mounted to the tail of the airplane 102. Antennas 112, 114 and 116 may comprise log antennas, periodic antennas, patch antennas, fractal antennas, fractional wavelength wire or any desired antenna that can be tuned to a specific frequency band. Cabling for the antennas can be fed through the boom 110 to the interior of the airplane 102.

Figure 2:
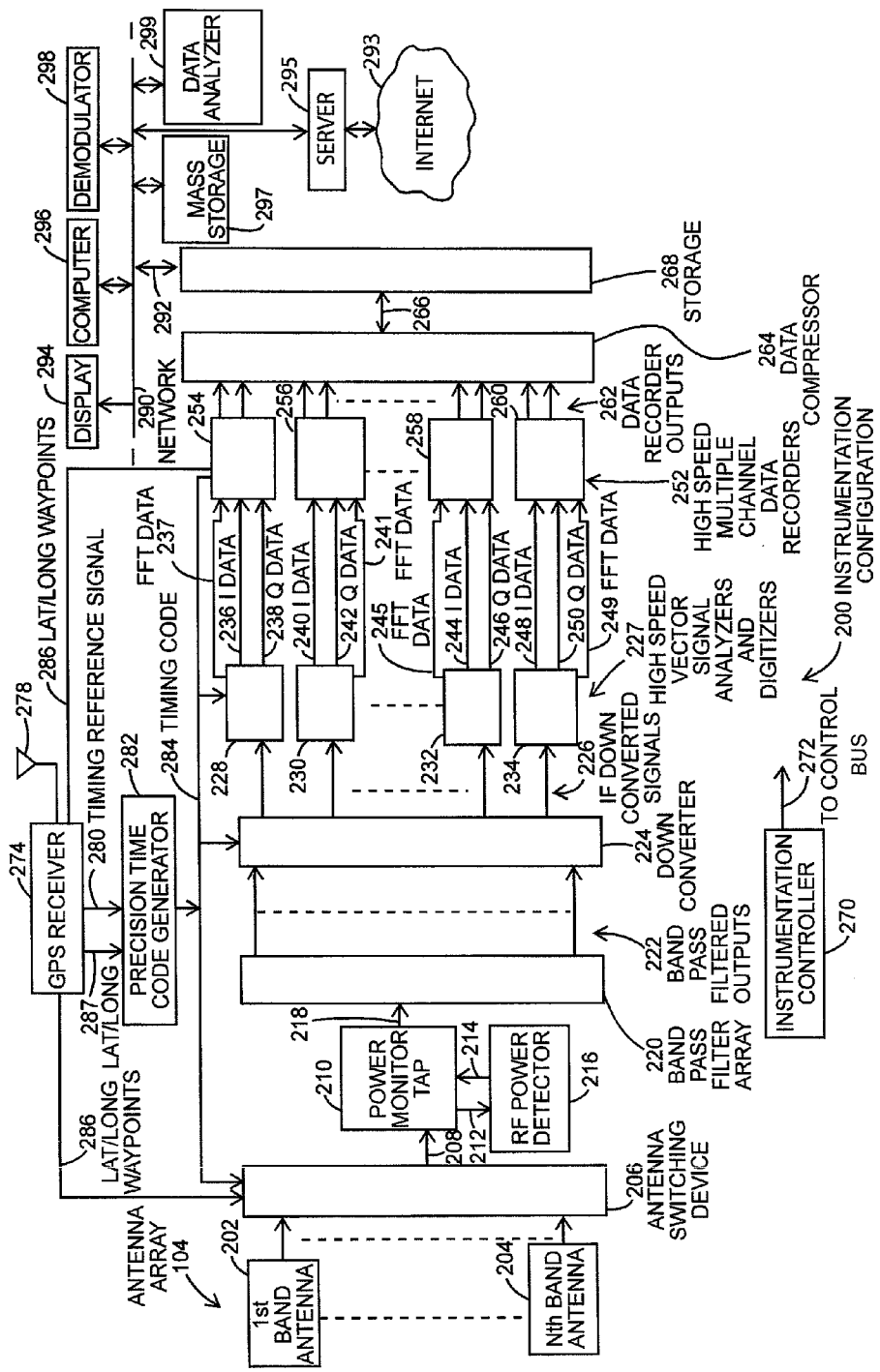
FIG. 2 is a schematic block diagram of one embodiment of an airborne instrumentation configuration for an electromagnetic spectrum aerial surveying system.

FIG. 2 is a schematic block diagram of one embodiment of an instrumentation configuration 200 that can be utilized to collect and process electromagnetic spectrum data from aircraft 102. As illustrated in FIG. 2, antenna arrays 104, 106 comprise a plurality of antennas, such as antennas 204, 206, that have an antenna gain profile to receive signals within specific frequency ranges and have a high out-of-band rejection profile. In this manner, the antenna array 202 functions as a front end filter to provide a series of filtered frequency band signals to instrumentation configuration 200, illustrated in FIG. 2. As disclosed above, the antennas in the antenna array 104 have a directional component that limits the amount of signal that can be detected in a horizontal direction, while the aircraft 102 (FIG. 1A) is in a generally horizontal disposition. The antenna arrays 104, 106 are directed in a generally downwardly direction, but can receive signals from an angled direction to some extent. If the antenna array was able to look directly horizontally, it would be difficult to distinguish the direction from which the signals were being received, and there would be a substantial amount of co-channel interference. Hence, antennas that are directed in a generally downward direction provide a better indication of the location from which the signals are being received. Also, many ground antennas generate patterns that emit radiation in a generally horizontal direction. However, most of these antennas have up angle patterns that allow detection at a distance. As such, low flying aircraft that are equipped with receiving antennas that are directed in a generally downward orientation, but have an angled cone pattern, are able to detect such transmissions on a direct line of sight. Trigonometric analyses coupled with techniques such as Doppler analysis, accurate real-time calibration and referencing, and timed-difference of-arrival methods can resolve signal sources, determine azimuths and elevations to various signal sources and isolate physical model parametric propagation coefficients that are often poorly characterized during path planning with propagation modeling tools.

As also illustrated in FIG. 2, the RF signals from the antenna arrays 104, 106 are transmitted to the antenna switching device 206. The antenna switching device 206 sequentially connects the outputs of each of the antennas 202, 204 from the antenna arrays 104, 106 to the power monitor tap 210. The sample time for each antenna is selected to obtain an adequate sampling at each set of frequency bands for each of the antennas in the antenna array 104. For example, sampling times may range from a few seconds to several minutes. The antenna sampling can occur either temporally or on a geospatial basis. For example, sampling of the antenna array 104 can occur periodically based upon a timing code pulse 284 generated by the precision time code generator 282. In that regard, GPS receiver 274 generates a timing reference signal 280 that may constitute one pulse per second that is a highly precise timing signal. The timing reference signal 280 is transmitted to the precision time code generator 282 as a reference signal for the precision time code generator 282. The precision time code generator 282 generates timing code 284 based upon timing reference signal 280. Alternatively, antenna switching can be initiated at waypoints provided by a lat/long position signal 286 from a GPS receiver 274. The advantage of using waypoints to trigger antenna switching is that the samples can be tied directly to a geospatial location. When using a simple time switching process, variations in ground speed can alter the spacing of the sampling. In addition, variations in the flight path of the airplane 102 (FIG. 1A) can alter the geospatial locations at which monitoring occurs using a simple time sampling process. If antenna sampling occurs at specified waypoints that are provided by the GPS receiver 274, the sampling locations can be more closely controlled and the ground speed of the airplane does not have to be exact. Additionally, the spacing of the waypoints may not necessarily always be even. For example, over large areas of vacant land, the spacing between waypoints may be greater, since tight sampling may not be required over large vacant areas. Also, GPS receiver 216 may be programmed with waypoints in a simple and easy manner prior to initiating a flight sampling process. The GPS receiver can also be used to assist in guiding the plane to the waypoints using an autopilot that is coupled to the GPS receiver.

The power monitor tap 210 of FIG. 2 is a power ranging device that prevents overloading of the circuitry of FIG. 2, especially the analog to digital converters in the high speed vector signal analyzers and digitizers 227. A broadband RF power detector 216 senses the magnitude 212 of the cumulative power of the detected signal 208 from each antenna of antenna array 104, which is transmitted via connector 212 to broadband RF power detector 216 on a real time basis. Power monitor tap 210 then scales the power level of the received signal from each antenna, in response to the cumulative power signal 214 from broadband RF power detector 216, to a level that can be handled by the band pass filter array 220, the frequency band down converter 224, and the high speed vector signal analyzers and digitizers 227. The broadband RF power detector 216 provides real time power detection that senses the overall power of the signal 212 received from each antenna in antenna arrays 104, 106. Power monitor tap 210 scales the power level, while maintaining data indicating the scaling factors.

The scaled signals 218 from the power monitor tap 210, as illustrated in FIG. 2, are then transmitted to a band pass filter array 220. The band pass filter array 220 comprises a plurality of active band pass filters that are connected in parallel. The band pass filter array 220 may be tuned for specific carrier waves in each of the frequency bands that are being analyzed, as illustrated and explained in more detail with respect to FIG. 3. The band pass filtered outputs 222 from each filter of the band pass filter array 220 are applied to the down converter 224. The frequency band down converter 214 downconverts the carrier signals to an IF frequency band to generate IF downconverted signals 226. The IF frequency is more easily processed by the high speed vector signal analyzers and digitizers 227.

The downconverter 224, illustrated in FIG. 2, downconverts the carrier frequencies using superheterodyne techniques. Each of the band pass filtered outputs 222 is applied to a mixer in the downconverter 224. The mixer is connected to a local oscillator that has a frequency at the center of the frequency of the band pass filtered output from each of the band pass filtered outputs 222. If the band pass filter array 220 uses band pass filters that correspond to known carrier frequencies for licensed users of each frequency band, the local oscillators can be tuned to the center frequencies of each of the carrier signals, which ideally would correspond to the center frequencies of the band pass filters. However, a voltage controlled oscillator can be used which allows for variation of the local oscillator frequency based upon carrier frequency. The downconverter 224 converts the carrier signal to an IF frequency by mixing the local oscillator signals with the band pass filtered outputs 222 to generate a plurality of IF downconverted signals 226. Each of the IF downconverted signals is filtered using active filters that are tuned to the IF frequency to band limit the signal. An anti-aliasing filter is also used to filter the downconverted outputs from downconverter 224 to prevent aliasing in the IF downconverted signals 226. The IF downconverted signals 226 are then applied to the high speed vector signal analyzers and digitizers 227, which comprise a plurality of separate high speed vector signal analyzers and digitizers, such as high speed vector signal analyzers and digitizers 228, 230, 232, 234.

The high speed vector signal analyzers and digitizers 227, illustrated in FIG. 2, are wide band vector signal analyzers that provide a digital output. The wideband vector signal analyzers 227 measure the magnitude and phase of the IF downconverted signals at a single frequency within the IF bandwidth of the instrument. Vector signal analyzers, in general, are capable of making in-channel measurements, such as error vector magnitude, code domain power, and spectral flatness, based upon reference signals. Generally, vector signal analyzers are useful in measuring and demodulating digitally modulated signals, such as W-CDMA, LTE, WLAN, as well as other modulation schemes on various carrier frequencies. Measurements provided by the vector signal analyzer, in general, can be used to determine the quality of modulation. Vector signal analyzers 227 may not be able to perform these functions, since these functions are normally performed when the signal is identified with respect to the modulation protocol used. Since there may be as many as 500 to 1,000 different types of modulation protocols, it is difficult for the vector signal analyzer 227 to perform these tasks. Rather, these tasks are performed by the demodulator 298 and data analyzer 299, as explained in more detail below. Both the frequency band down converter 224, and the high speed vector signal analyzers and digitizers 227, may comprise a single device that performs the functions of a wide band vector signal analyzer.

The high speed vector signal analyzers and digitizers 227, illustrated in FIG. 2, include analog-to-digital converters that convert the IF downconverted signals 226 to digital signals. The A to D converters are high speed A to D converters that typically have a 14-bit resolution. The sampling rate of the digitizers can be varied depending upon the frequency span of each of the IF downconverted signals 226. The high speed digitizers and the high speed vector signal analyzers and digitizers 227 may sample at rates of up to 600 megabytes per second. Typically, the digitizers use a 14-bit resolution. In that regard, data can be created at a rate of approximately 600 megabytes per second, which results in terabytes of data being generated for each hour of scanning. Because of the large amount of data, data compression techniques should be used to effectively utilize and store the data, since even high speed work stations are incapable of processing that large amount of data in a reasonable time period. Once the IF downconverted signals 226 are digitized, the digitized IF downconverted signals 226 are separated into quadrature and in-phase components using a quadrature detector, which is typically implemented in a discreet Hilbert transform. The I and Q data 236, 238, 240 and 242, 244 and 246, and 248 and 250, generated by high speed vector signal analyzers and digitizers 227, 230, 232 and 234, respectively, is transmitted to high speed multiple channel data recorders 254, 256, 258, 260, respectively, which are collectively referred to as high speed multiple channel data recorders 252.

The high speed vector signal analyzers and digitizers 227, illustrated in FIG. 2, also generate a frequency domain signal, such as FFT data 237, 241, 249. The FFT data 237, 241, 249 is also transmitted to the high speed multiple channel data recorders 252 for recording with the time domain I/Q data 236, 238, 140, 242, 244, 246, 248, 250. The high speed multiple channel data recorders 252, illustrated in FIG. 2, also record a time code 284 from the precision time code generator 282 and/or a latitude/longitude waypoint 286 from GPS receiver 274 with the I and Q data 236, 238, 240, 242, 244, 246, 248, 250. In this manner, the recorded data is associated with a geospatial location and/or a time code 284 that includes latitude/longitude information. In that regard, GPS receiver 274 transmits latitude/longitude information 287 to the precision time code generator 282 so that the timing code 284 includes latitude/longitude information provided by the GPS receiver 274. The recorded data, in the form of data recorded outputs 262, are then transmitted to a data compressor 264.

Various types of data compressors 264 can be used in the embodiment illustrated in FIG. 2. For example, video data compression techniques can be utilized in data compressors 264, such as MPEG-2 and MPEG-4 techniques to compress the data recorder outputs 262. The compressed data 266 can then be transmitted to mass storage 268, where the compressed data can be stored. Mass storage device 268 is connected through a network connector 292 to a network 290. Instrumentation controller 270 is connected to a control bus 272 and provides instructions to control the instrumentation illustrated in FIG. 2. The instrumentation illustrated in FIG. 2 is also connected to the control bus 272.

The network 290, as well as the display 294, computer 296, demodulator 298, mass storage device 297, and data analyzer 299, illustrated in FIG. 2, may all be disposed at a ground location. Data from the mass storage device 268 can be downloaded through network link 292 to the network 290 for storage in mass storage device 297. Computer 296 can function as a controller for accessing data stored in mass storage device 297 to demodulate the data in demodulator 298, display the data in display 294, analyze the data in data analyzer 299, and interface with the server 295 that is connected to the Internet 293. Demodulator 298 can comprise any desired type of modulator. If video data compression techniques have been used in data compressor 264, a standard video demodulator can be used in demodulator 298. For example, data encoded using standards proposed by the Moving Picture Expert Group, such as MPEG-2 or MPEG-4 video data compression techniques, can be demodulated by demodulator 298 using standard video demodulators, such as found in TV modem devices. The decoded data can then be displayed on display 294. Further, data analyzer 299 may utilize various techniques for analyzing the various data streams to identify aspects of the data streams, including identifying carrier frequencies and modulation protocols, determining the quality of modulation of the signal, location of the source of the transmissions, and data density, and other parameters relating to the type and quality of the signals. The data analyzer 299 may perform pattern recognition on demodulated video renderings of the data. For example, the data analyzer 299 may identify the carrier frequency and carrier bandwidth, perform pattern recognition analysis to identify the type of signal and compare the signal with known licensed bands and the modulation protocols utilized in those licensed bands. For example, the PCS band spans frequency ranges from 1930 MHz to 1990 MHz. These signals comprise cell phone signals, paging and messaging. Protocols, such as GSM, CDMA, and other protocols, can be associated with PCS band signals. By identifying the frequency ranges of the carriers, and knowing the licensed bands, the modulation protocol can be identified or narrowed to several alternatives. In this manner, modern, high efficiency protocols can be identified, including the format density of the data. This may assist users in identifying the efficiency of use of the licensed spectrum by licensed users of the frequency spectrum. Identified modulation protocols can be used to test the signal to determine if a match exists. Also, signals that have a good signal to noise ratio can be analyzed and signals that have bad signal to noise ratio can be discarded. In addition, spurious signals that should not be in these bands can also be identified. For example, intermodulation can be detected, identified in the data, and discarded as part of the recognition process. In this manner, both data that should be included, as well as data that should not be included, can be identified, so that the pattern recognition algorithms can be used more effectively to identify modulation protocols. In addition, spurious signals that may constitute transmissions by unlicensed users can also be identified.

Once a pattern is recognized, using pattern recognition techniques, further data analysis to provide quality information relating to the data signals can be performed by data analyzer 299. For example, modulation domain charts, such as constellation diagrams, can be generated, as well as code domain charts, both of which provide information regarding the quality of the transmissions. The analysis of the data, as well as the use of pattern recognition techniques to identify particular signals can be performed at any desired level, depending upon the amount and type of data that is displayed on display 294. Of course, multiple high speed data analyzers can be used to analyze the various signals that are recorded by the high speed multiple channel data recorders 252. The analyzed data from data analyzer 299 is stored in the mass storage device 297. A server 295 can connect the network 290 to the internet 293 to provide a web-based application for displaying the data that has been analyzed and stored in mass storage device 297. Examples of the manner in which the data can be displayed is described more fully with respect to FIGS. 3 and 4.

Figure 3:
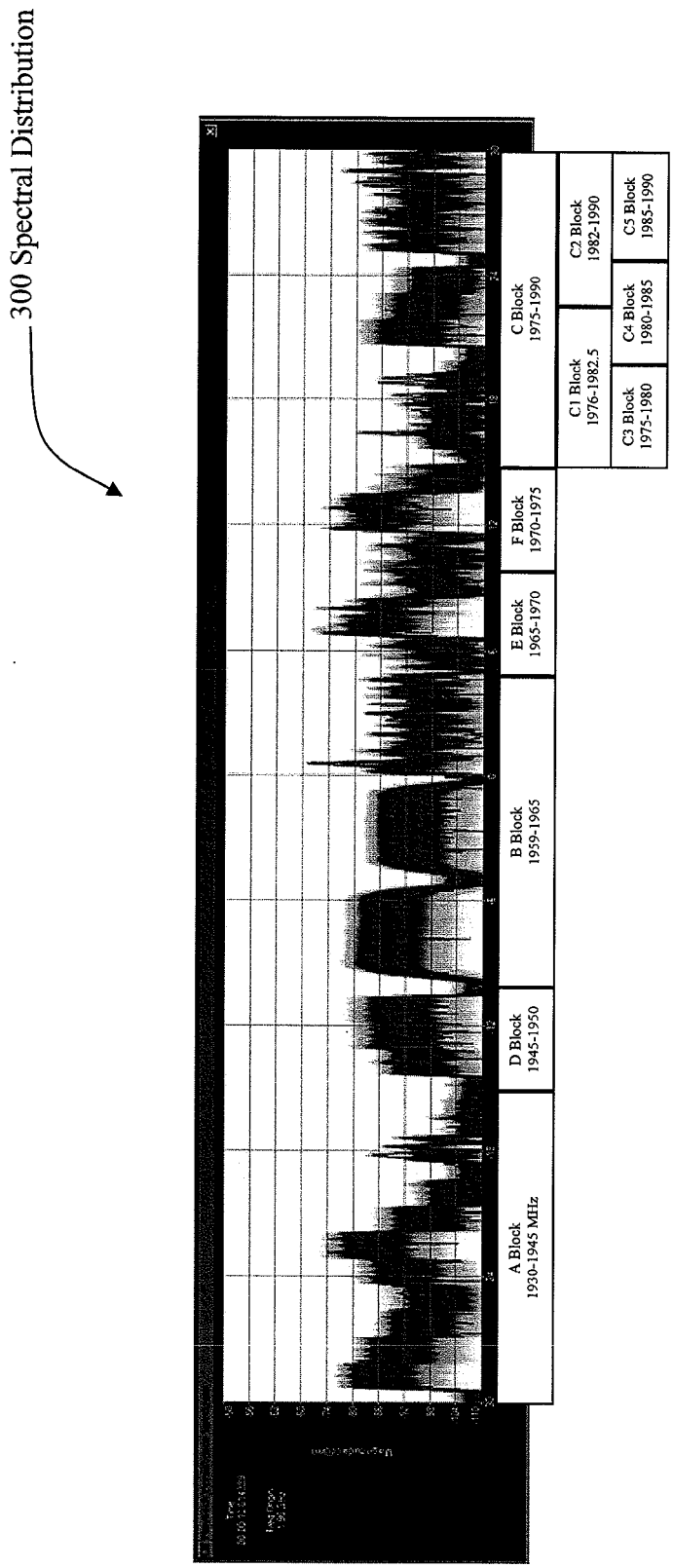
FIG. 3 is a representation of signal strength versus various frequency blocks according to FCC database licensed use.

FIG. 3 is an example of the spectral distribution 300 of sample data from a particular geospatial location at one instant in time. The spectral distribution 300 illustrates the spectral bandwidth and magnitude of signals detected at various frequencies. The data is displayed with respect to various blocks that span various spectral ranges. Each of these blocks can be tied to licensed spectra. The spectral distribution 300 of the various waveforms provides information relating to the spectral bandwidth of various carriers and the magnitude of the carrier signals. For example, block A, which spans the bandwidth of 1930 MHz to 1945 MHz, illustrates eleven different carrier signals. Block B appears to display three different carriers having broad spectral ranges. This data can be tied to the licensed carriers at these frequencies to provide information relating to the type of signal detected.

Figure 4:
FIG. 4 is a schematic representation of a screen for displaying data of various GIS locations.

FIG. 4 is a schematic illustration of one embodiment of a display that can be utilized to display the data stored in mass storage device 297. As illustrated in FIG. 4, a GIS map is displayed that graphically illustrates geospatial information. A target area can be identified by a user by clicking on a particular location. An insert is displayed, which can provide time elapsed signals indicating the frequency and magnitude of the signals within various spectral ranges. In addition, data can be displayed in the frequency domain, such as illustrated in FIG. 3, which shows the distribution, the magnitude of the various carrier signals at the geospatial location targeted by the user. By clicking on the insert, the time lapse data collected for the target location can be displayed to the user in both the temporal and frequency domain. The frequency spectral data that can be displayed in the insert, as well as the temporal data which can be played against a three dimensional GIS display, provides a fourth dimension of information. In addition, information can be displayed with respect to any particular carrier, including carrier classification, such as LTE, EDGE, GSM, LTE-A, HSPA, WiMAX, etc. In this manner, the quality of the signal can also be analyzed and displayed. The target area creates a GIS map link to the data for that area, which is stored in memory 297. In addition, a signal level meter may be provided, which displays the quality parameters, such as MER, EVM, data rate, format, and other quality parameters for a selected signal, or level information for a selected band. Information on the signal level can be extended to alpha blended data to show coverage at a desired range from the target center.

Hence, the various embodiments disclosed herein provide methods of collecting and analyzing data for display. Aerial collection of data at low levels, such as between 1,000 and 1,500 feet above ground surface, can be used to detect direct line of sight transmissions from ground transmitters. Antenna arrays 104, 106 can be used to filter different frequency spectra, and provide prefiltered data to the instrumentation 200, illustrated in FIG. 2. The data can be collected quickly and inexpensively using aerial scanning techniques with a high degree of accuracy, because of the line of sight collection of spectral data that does not suffer from ground-based data collection techniques that are expensive and time consuming. Wide band, high speed vector signal analyzers and digitizers create frequency spectrum data, as well as I and Q temporal data. Data compression techniques, such as video data compression, can be used to allow a high degree of compression and the ability to simply and easily display the data using video demodulators. Pattern recognition techniques can be used to identify the data and analyze the quality of the data signals. Display techniques can be utilized, including the use of GIS maps that allow users to identify particular geographical areas and view the signals and the signal densities in these areas. This assists in creating a national broadband map of the empirical data that heretofore has not been available.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of aerial surveying of electromagnetic signals having a broad frequency spectrum over a large geographical area to reduce the effects of ground scatter interference and signal reflections comprising:

flying an airplane over said large geographical area to detect said electromagnetic signals at specific locations traversed by said airplane in said large geographical area;

detecting said electromagnetic signals by said airplane using a plurality of antennas that are tuned to a plurality of frequency bands to produce a plurality of frequency band antenna signals from said plurality of antennas;

band pass filtering said frequency band antenna signals to produce a plurality of filtered frequency band signals that have different frequency spectra;

generating geospatial data relating to said specific locations at which said frequency band antenna signals are detected by determining locations of said airplane when said frequency band antenna signals are detected;

digitizing said plurality of filtered frequency band signals to produce digitized frequency band signals;

tagging said digitized frequency band signals with said geospatial data;

performing vector analysis using a vector signal analyzer on said digitized frequency band signals to provide vector analyzed data regarding said digitized frequency band signals that comprises digital in-phase and quadrature phase data;

generating frequency domain data from said digitized frequency band signals;

compressing said vector analyzed data and said frequency domain data using video data compression techniques to produce compressed digital band data;

storing said compressed digital band data in a mass storage device;

analyzing said compressed digital band data stored in said mass storage device to determine spectrum utilization.

2. The method of claim 1 wherein said process of analyzing said compressed digital band data comprises:

determining carrier wave frequencies of said electromagnetic signals;

selecting modulation techniques used for said carrier wave signals to identify a modulation technique used on said electromagnetic signals.

3. The method of claim 2 further comprising:

determining a modulation technique used to modulate said electromagnetic signals using recognition techniques;

demodulating said compressed digital band data to obtain signal quality data.

4. The method of claim 1 wherein said process of generating geospatial data comprises:

generating waypoints in a geospatial area for aerial surveying that correspond to said specific locations;

flying said airplane to said waypoints;
automatically generating a trigger signal when said airplane reaches a waypoint;
sampling said electromagnetic signal in response to said trigger signal to obtain said plurality of frequency band antenna signals at each waypoint reached by said airplane.

5. The method of claim 1 wherein said process of generating geospatial data comprises:
flying said airplane in a specified pattern to covers locations in said large geographical area for aerial surveying;
using a timing code that generates a trigger signal to sample said electromagnetic signals from said plurality of antennas.

6. The method of claim 4 further comprising:
using an autopilot to fly said airplane to said waypoints.

7. The method of claim 6 further comprising:
storing said analyzed frequency band data on a network accessible storage device.

8. The method of claim 3 wherein said process of determining said modulation technique used to modulate said electromagnetic signals using pattern recognition techniques comprises:
utilizing pattern recognition techniques to identify a type of said electromagnetic signals to produce identified specific electromagnetic signals.

9. The method of claim 8 further comprising:
comparing said identified specific electromagnetic signals with licensed transmissions in corresponding frequency bands to identify types of modulation protocols used in said frequency band to produce identified modulation protocols.

10. The method of claim 9 further comprising:
demodulating said identified specific electromagnetic signals with said identified modulation protocols to produce a demodulated signal.

11. The method of claim 10 further comprising:
analyzing said demodulated signal to generate signal quality data.

12. The method of claim 11 further comprising:
displaying said demodulated signal and said signal quality data.

13. The method of claim 12 wherein said process of displaying comprises:
providing a web-based GIS map that links to said quality data, said in-phase and quadrature phase data and said frequency domain data to geospatial locations on said GIS map.

14. The method of claim 1 further comprising:
sequentially sampling said plurality of frequency band antenna signals.

15. A system for aerial surveying of a broad frequency spectrum of electromagnetic signals at specific locations over a large geographical area comprising:
a plurality of antennas that are mounted on an airplane that flies over said large geographical area at altitudes that are sufficiently low to detect said electromagnetic signals, said antennas tuned to a plurality of frequency bands to produce a plurality of frequency band antenna signals from said plurality of antennas;
band pass filters that filter said frequency band antenna signals to produce a plurality of filtered frequency band signals;
analog to digital converters that digitize said filtered frequency band signals to produce digitized frequency band signals;
a geospatial receiver that captures geospatial data relating to said specific locations at which said frequency band antenna signals are detected by said plurality of antennas by determining locations of said airplane when said frequency band antenna signals are detected;
vector signal analyzers that receive said digitized frequency band signals and generate digital in-phase and quadrature phase data corresponding to said electromagnetic signals;
frequency analyzers that receive said digitized frequency band signals and generate frequency domain data corresponding to said electromagnetic signals;
high speed, multiple channel recorders that tag said digital in-phase and quadrature phase data with said geospatial data;
a video data compressor that compresses said digital in-phase and quadrature phase data and said frequency domain data to produce compressed digital band data;
a mass storage device that stores said compressed digital band data.

16. The system of claim 15 wherein said geospatial receiver further comprises:
a waypoint generator that is capable of generating waypoints in said large geographic area;
a signal generator that automatically generates a trigger signal when said airplane reaches a waypoint;
an antenna switching device that samples said electromagnetic signals in response to said trigger signal.

17. The system of claim 16 further comprising:
an autopilot on said airplane that guides said airplane to said waypoints.

18. The system of claim 15 further comprising:
an autopilot that flies said airplane in a pattern that covers locations in said large geographical area for aerial surveying;
a geospatial receiver that generates timing signals;
an antenna switching device that automatically samples said electromagnetic signals in response to said timing signals.

19. The system of claim 15 further comprising:
an analyzer that compares said in-phase and quadrature phase data and said frequency domain data with licensed transmissions in corresponding frequency bands to identify types of modulation protocols used in said corresponding frequency bands to produce identified modulation protocols.

20. The system of claim 19 further comprising:
a demodulator that demodulates said identified electromagnetic signals in accordance with said identified modulation protocols to produce demodulated signals.

21. The system of claim 20 wherein said data analyzer further comprises:
an analyzer that analyzes said demodulated signals to generate signal quality data.

22. The system of claim 21 further comprising:
a web-based mass storage that stores said compressed digital band data;
a server that provides access to said compressed digital band data.

23. The system of claim 22 further comprising:
a computer that links said compressed digital band data to locations on a GIS map.

* * * * *